(12) United States Patent
Hollis

(10) Patent No.: US 8,559,558 B2
(45) Date of Patent: Oct. 15, 2013

(54) REFERENCE VOLTAGE GENERATOR FOR SINGLE-ENDED COMMUNICATION SYSTEMS

(75) Inventor: Timothy M. Hollis, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 732 days.

(21) Appl. No.: 12/701,697

(22) Filed: Feb. 8, 2010

(65) Prior Publication Data

US 2011/0193620 A1 Aug. 11, 2011

(51) Int. Cl.
*H04L 25/06* (2006.01)
(52) U.S. Cl.
USPC ........................ 375/317; 323/281; 365/189.09
(58) Field of Classification Search
None
See application file for complete search history.

(56) References Cited

U.S. PATENT DOCUMENTS

| | | | |
|---|---|---|---|
| 6,366,506 B1 * | 4/2002 | Mizuno et al. | 365/189.09 |
| 2008/0068316 A1 * | 3/2008 | Maekawa | 345/87 |
| 2008/0315849 A1 * | 12/2008 | Gerritsen | 323/282 |

OTHER PUBLICATIONS

"Cascode", Wikipedia, http://en.wikipedia.org/wiki/Cascode, 7 pages (Jan. 5, 2010).
U.S. Appl. No. 12/359,299, filed Jan. 24, 2009, Dimitriu et al.

* cited by examiner

*Primary Examiner* — Adolf Dsouza
(74) *Attorney, Agent, or Firm* — Schwegman, Lundberg & Woessner, P.A.

(57) ABSTRACT

In various embodiments, a reference voltage ($V_{ref}$) generator for a single-ended receiver in a communication system is disclosed. The $V_{ref}$ generator in one example comprises a cascoded current source for providing a current, I, to a resistor, $R_b$, to produce the $V_{ref}$ voltage ($I*R_b$). Because the current source isolates $V_{ref}$ from a first of two power supplies, $V_{ref}$ will vary only with the second power supply coupled to $R_b$. As such, the $V_{ref}$ generator is useful in systems employing signaling referenced to that second supply but having decoupled first supplies. For example, in a communication system in which the second supply (e.g., $V_{ssq}$) is common to both devices, but the first supply ($V_{ddq}$) is not, the disclosed $V_{ref}$ generator produces a value for $V_{ref}$ that tracks $V_{ssq}$ but not the first supply.

21 Claims, 9 Drawing Sheets

$Vref = m * (Vddq - Vssq) + b$

*(from U.S. Ser. 12/359,299)*

$Vref = m * (Vddq - Vssq)$

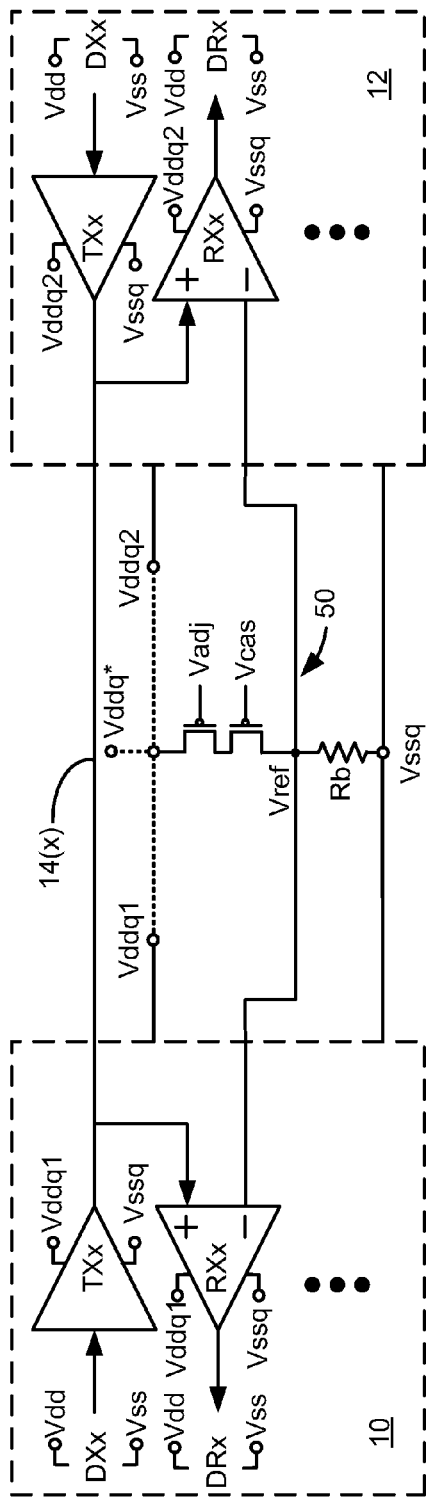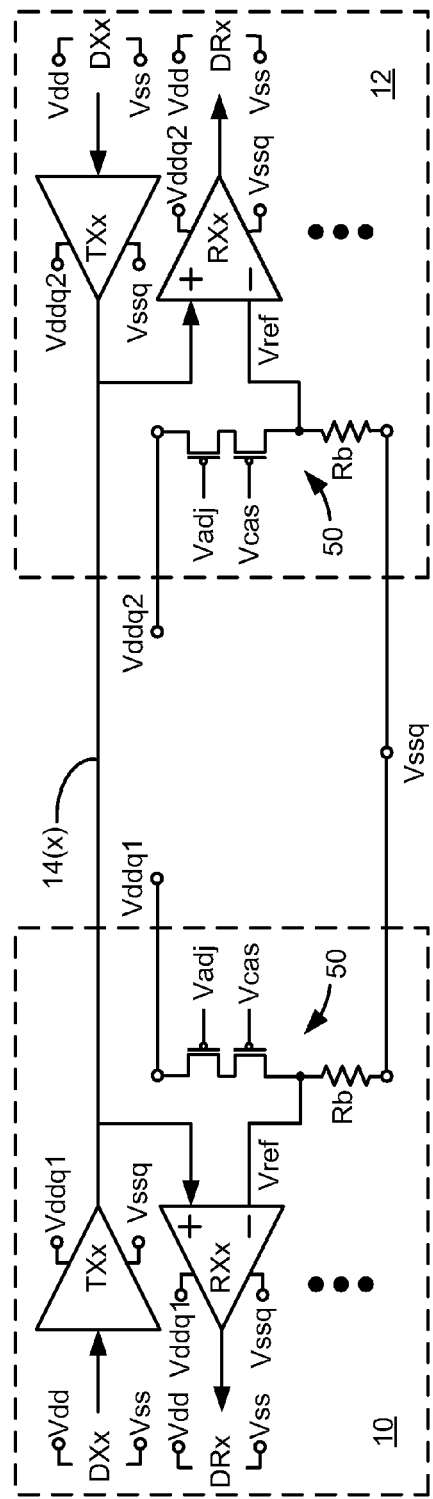

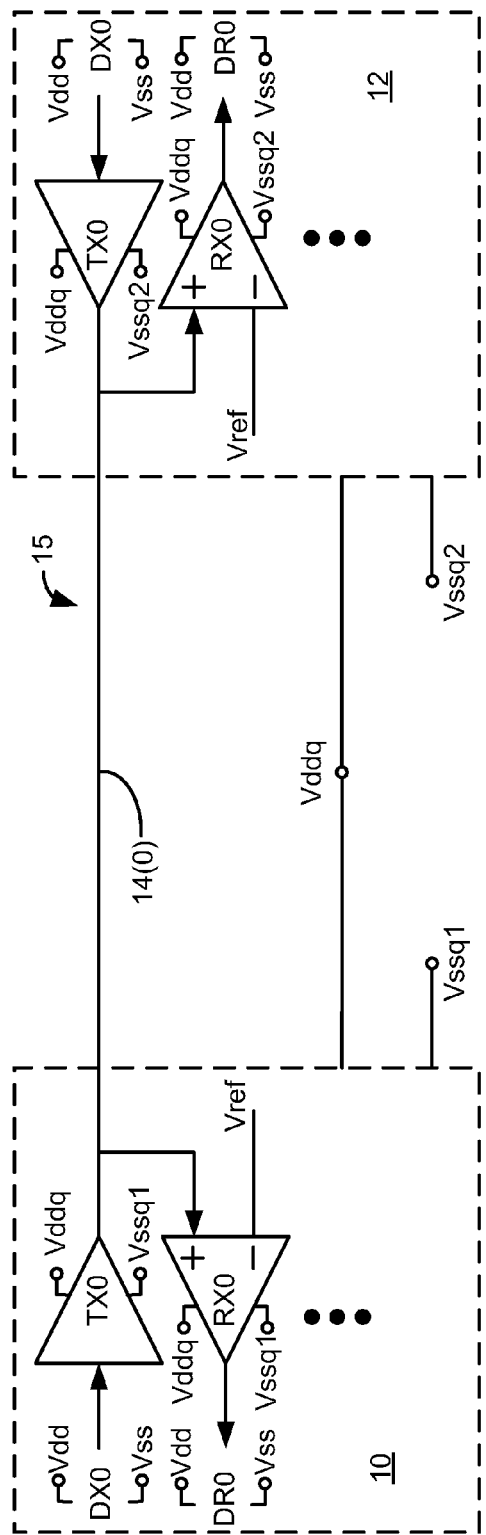
*Figure 9A*
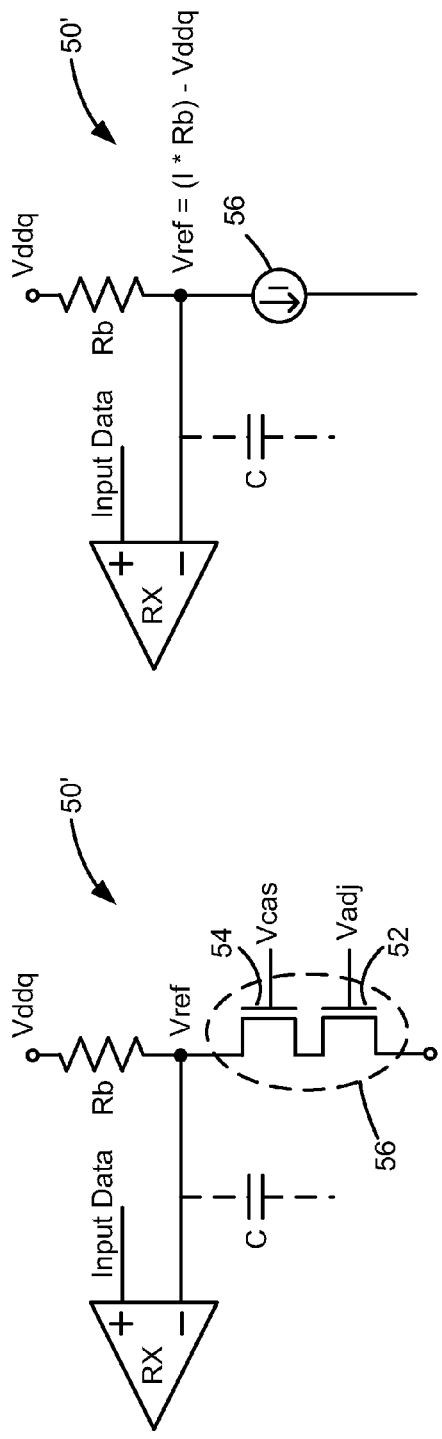
*Figure 9C*
*Figure 9B*

REFERENCE VOLTAGE GENERATOR FOR SINGLE-ENDED COMMUNICATION SYSTEMS

FIELD OF THE INVENTION

Embodiments of this invention relate to an improved reference voltage generator having particular utility in sensing data in single-ended communication channels.

BACKGROUND

FIG. 1 shows a plurality of communication channels 14(x) for communicating data between a first device 10 and a second device 12. In one embodiment the devices 10 and 12 can comprise discrete integrated circuits, such as a Synchronous Dynamic Random Access Memory (SDRAM) and a microprocessor in one example. In this example, communication channels 14(x) would typically comprise traces in a printed circuit board (PCB) 15. Alternatively, devices 10 and 12 could comprise circuit blocks in a planar configuration on a common substrate, with channels 14(x) comprising traces on the substrate. In yet another alternate configuration, the devices 10 and 12 might be integrated vertically (stacked) into a single package.

The communication channels 14(x) as illustrated are bidirectional, allowing data to be sent from device 10 to device 12 and vice versa. When data is sent from device 10 to device 12, the transmitters TX are activated in device 10 and the receivers RX are activated in device 12. Likewise, when data is sent from device 12 to device 10, the transmitters TX are activated in device 12 and the receivers RX are activated in device 10.

As shown, each of the illustrated communication channels 14(x) are "single-ended," meaning that the transferred data only appears at one point in a given receiver, RX. By contrast, other communication channels in the art are fully differential, meaning that data and its complement are transferred on two traces, with both the true and complement data values being received at a differential receiver. See, e.g., U.S. patent application Ser. No. 11/972,209, filed Jan. 10, 2008.

The received data at each receiver RX, typically implemented as amplifiers, is compared to a reference voltage, Vref. As is well known in such single-ended applications, Vref comprises a threshold, such that data having a higher voltage than Vref is interpreted by the receiver RX as a logic '1', while data having a lower voltage than Vref is interpreted as a logic '0'. The comparison of the data and Vref at the receivers is sometimes known in the art as a "pseudo differential" approach, owing to the fact the Vref is a mere threshold voltage, rather than a data complement.

Limited pin count, lower power, and the availability of legacy design work motivate the effort to increase the bandwidth of, and hence prolong the life of, single-ended signaling. While most single-ended signaling innovation targets either noise reduction through encoding techniques and supply insensitive circuit design, or bandwidth enhancement through equalization, comparatively little attention been given to techniques for reference voltage (Vref) generation, an important parameter that impacts the voltage and timing margins of the communication channels. Previous approaches to Vref generation as have occurred historically in the development of DDR SDRAM technologies are discussed in U.S. patent application Ser. No. 12/359,299 ("the '299 application"), filed Jan. 24, 2009, which is incorporated herein by reference in its entirety, and with which familiarity is assumed.

Regardless of whether Vref is generated on the PCB 15 and sent to both of devices 10 or 12, or whether Vref is generated by each of those devices internally, FIG. 2A provides a typical Vref generator 16 comprising a voltage divider formed by resistances Ra and Rb. As discussed in the '299 application, Ra and Rb can be adjustable, and such adjustability can be of particular benefit when the signals transmitted on the channels 14 are referenced to either of the I/O power supplies Vddq or Vssq. As one skilled in the art will understand, I/O power supplies Vddq and Vssq are isolated from the corresponding power supplies Vdd and Vss, which are used internal to the devices 10 and 12. Thus, Vddq and Vssq typically only provide power to the off-chip interface circuitry, whereas Vdd and Vss power the remainder of the circuitry. Dividing the power domains in this manner helps to keep noise in the communication channels 14(x) from affecting internal signaling such as internal transmitted and received data signals DXx and DRx referenced to the Vdd/Vss domain (FIG. 1). Vddq and Vssq are often shared between the devices 10 and 12 in a typical communication system, as shown in FIG. 1.

Power supply-referenced signaling is shown in FIG. 3. Circuit trace 25 shows an example of Vddq-referenced signaling, in which data states are generated with respect to Vddq at the various transmitters TX, with a logic '1' equaling Vddq (perhaps with slight negligible degradation $\delta$), and logic '0' equaling Vddq-$\Delta$, which value will generally be higher than Vssq by an appreciable amount. Trace 25 is sometimes referred to as high common mode signaling. Circuit trace 26 shows an example of Vssq-referenced signaling, in which data states are generated with respect to Vssq at the various transmitters TX, with a logic '0' equaling Vssq (again, perhaps with some negligible degradation $\delta$), and logic '1' equaling Vssq+$\Delta$, which value will generally be lower than Vddq by an appreciable amount. Trace 26 is sometimes referred to as low common mode signaling. In either case, the power supply-referenced signaling illustrated comprises a reduced swing signal, because while the voltage level for one of the logic states is essentially at the referenced supply, the voltage level for the other logic states is well short of the non-referenced supply.

If Ra and Rb are adjustable in Vref generator 16, then Vref can generally be set to the middle of the two logic states to allow proper sensing of the power supply-referenced signals at the receivers RX. For example, if Vddq-referenced signaling is used, Vref(h) can be set at approximately Vddq−½$\Delta$, ignoring any degradation; if Vssq-referenced signaling is used, Vref(1) can be set at approximately Vssq+½$\Delta$, again ignoring any degradation.

The Vref generator 16 of FIG. 2A produces a reference voltage Vref that scales with a difference in the I/O power supplies, such that Vref=m*(Vddq−Vssq), with m=(Rb/(Ra+Rb)). Scaling of Vref with respect to Vddq and Vssq is beneficial when either Vddq-referenced or Vssq-referenced signaling is used, because any perturbations on Vddq or Vssq would tend to manifest in the generated Vref, thus facilitating data sensing at the receivers RX. Consider Vddq-referenced signaling: if Vddq dips low for a moment, then both the voltages for a logic '1' (essentially Vddq) and a logic '0' (Vddq-$\Delta$) generated at the transmitters TX will also dip low. However, Vref (Vddq−½$\Delta$) will likewise dip low, and therefore the perturbations in Vddq are canceled out at the receivers RX. Similarly, consider Vssq-referenced signaling: if Vssq spikes high for a moment, then both the voltages for a logic '1' (Vssq+$\Delta$) and a logic '0' (essentially Vssq) generated at the transmitters TX will also spike high. However, Vref (Vssq+½$\Delta$) will likewise spike high, and therefore the perturbations in Vssq are canceled out at the receivers RX. In either case, because the generated Vref value tracks both Vddq and Vssq, either Vddq- or Vssq-referenced signaling can be used.

Because certain degradations discussed in the '299 application can cause the shape of the "data eye" of the transmitted data to vary from ideal levels, the Vref resulting from the generator 16 of FIG. 2A may not be optimal, and it may not be optimal to position Vref exactly at the midpoint between the voltages for a logic '0' and '1'. To allow for more particularized tuning of Vref in light of such degradations, and as shown in FIG. 2B, the '299 application proposes a Vref generator 30 which adds a scalable offset, b. An adjustable current source 32 is used to adjust the offset b between the power supplies and Vref, while adjustable resistors Ra and Rb are used to adjust the slope m between the power supplies and Vref as in the prior art, such that Vref $=m^*(Vddq-Vssq)+b$, or Vref$=m^*Vddq+b$ if Vssq is assumed as zero. Similarly to FIG. 2A, the Vref value of FIG. 2B tracks both Vddq and Vssq, which facilitates sensing as discussed above.

While these previous approaches to Vref generation can be put to good use in a particular application, the inventor has noticed that they do not provide an optimal solution for every conceivable communication system, particularly one in which one of power supplies Vddq or Vssq are not shared between the devices 10 and 12. This disclosure provides an improved Vref generator design for such a communication system.

BRIEF DESCRIPTION OF THE DRAWINGS

FIGS. 6A-6C illustrate different manners of incorporating the Vref generators of FIGS. 5A and 5B into the system of FIG. 4, and specifically shows a Vref generator shared between the devices (FIG. 6A) and dedicated generators internal to each of the devices (FIGS. 6B and 6C).

FIGS. 9A-9C illustrate an alternative Vref generator suitable for use in a communication system having a common Vddq supply, but in which each device has its own decoupled Vssq supply (Vssq1 and Vssq2).

DETAILED DESCRIPTION

An improved reference voltage (Vref) generator for a single-ended receiver in a communication system is disclosed. The Vref generator in one example comprises a cascoded current source for providing a current, I, to a resistor, Rb, to produce the Vref voltage (I*Rb). Because the current source isolates Vref from a first of two power supplies, Vref will vary only with the second power supply coupled to Rb. As such, the improved Vref generator is useful in systems employing signaling referenced to that second supply but having decoupled first supplies. For example, in a communication system in which the second supply (E.g. Vssq) is common to both devices, but the first supply (Vddq) is not, the disclosed Vref generator produces a value for Vref that tracks Vssq but not the first supply (Vddq). This improves the sensing of Vssq-referenced signals in such a system.

Figure 1:
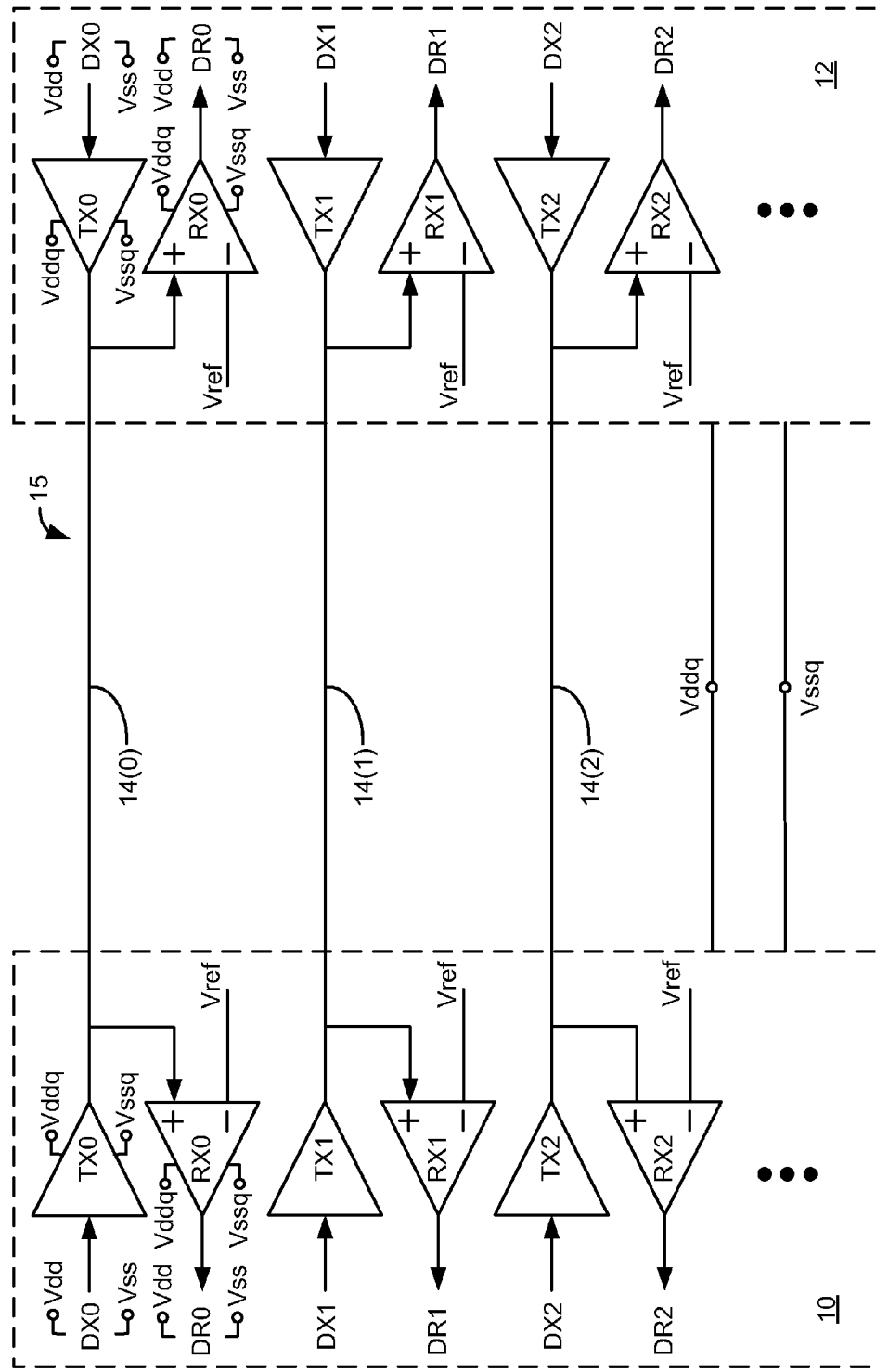
FIG. 1 illustrates a prior art communication system using single-ended data receivers which receives a reference voltage, Vref.
Figure 2B:
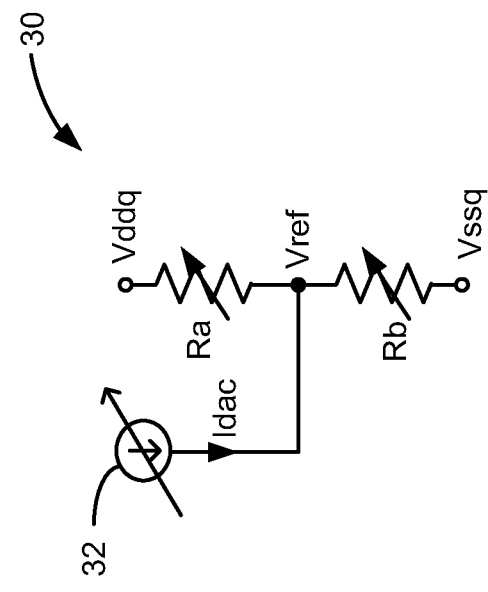
FIGS. 2A and 2B illustrate previous circuits for generating Vref to be used by the single-ended data receivers in the prior art system of FIG. 1.
Figure 2A:
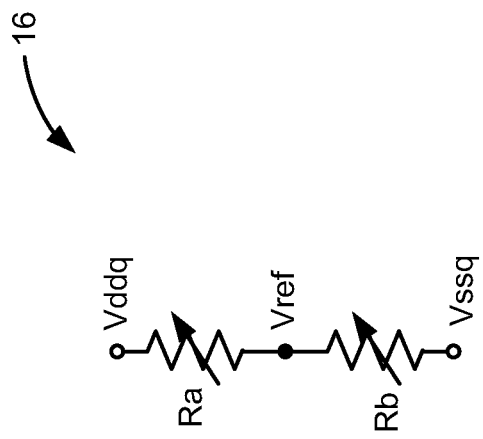

The inventor has realized that previous approaches to Vref generation, as shown in FIGS. 2A and 2B, are problematic in a communication system in which one of the I/O power supplies are not shared between the devices 10 and 12. Consider for example the communication system shown in FIG. 4. In this system, the low power supply, Vssq, is shared between devices 10 and 12, which may comprise a system ground coupled to even further devices not shown. The high power supplies by contrast are not shared: device 10 uses Vddq1 while device 12 uses Vddq2. In an actual system, Vddq1 and Vddq2 can be different voltage values. This is not uncommon: for example, device 10 may comprise a microcontroller with a 1.0 V supply, while device 12 comprises an SDRAM with a 1.2 V supply. Or, Vddq1 and Vddq2 may comprise the same voltage value but may still be decoupled from each other. For example, different voltages generators can be used to generate Vddq1 and Vddq2, which might be indicated if there are concerns about noise from one device's supply affecting the other.

Figure 3:
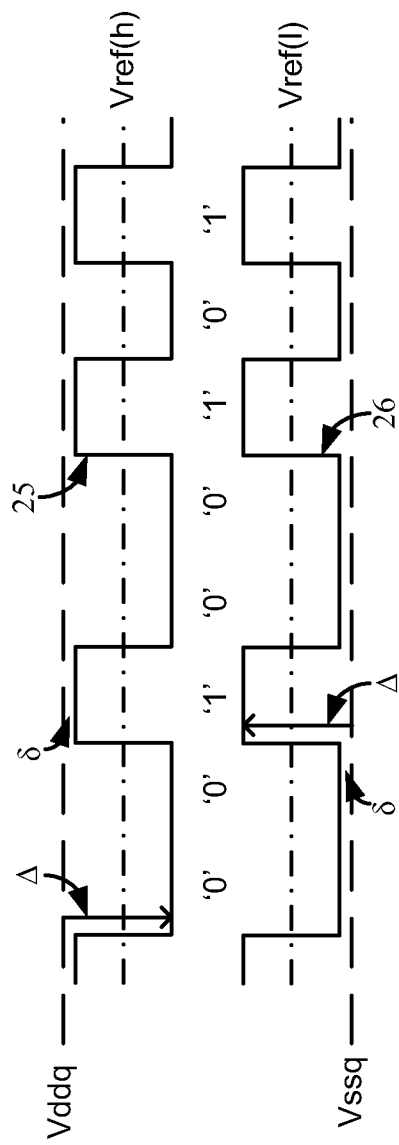
FIG. 3 illustrates examples of Vddq-referenced and Vssq-reference signaling.
Figure 4:
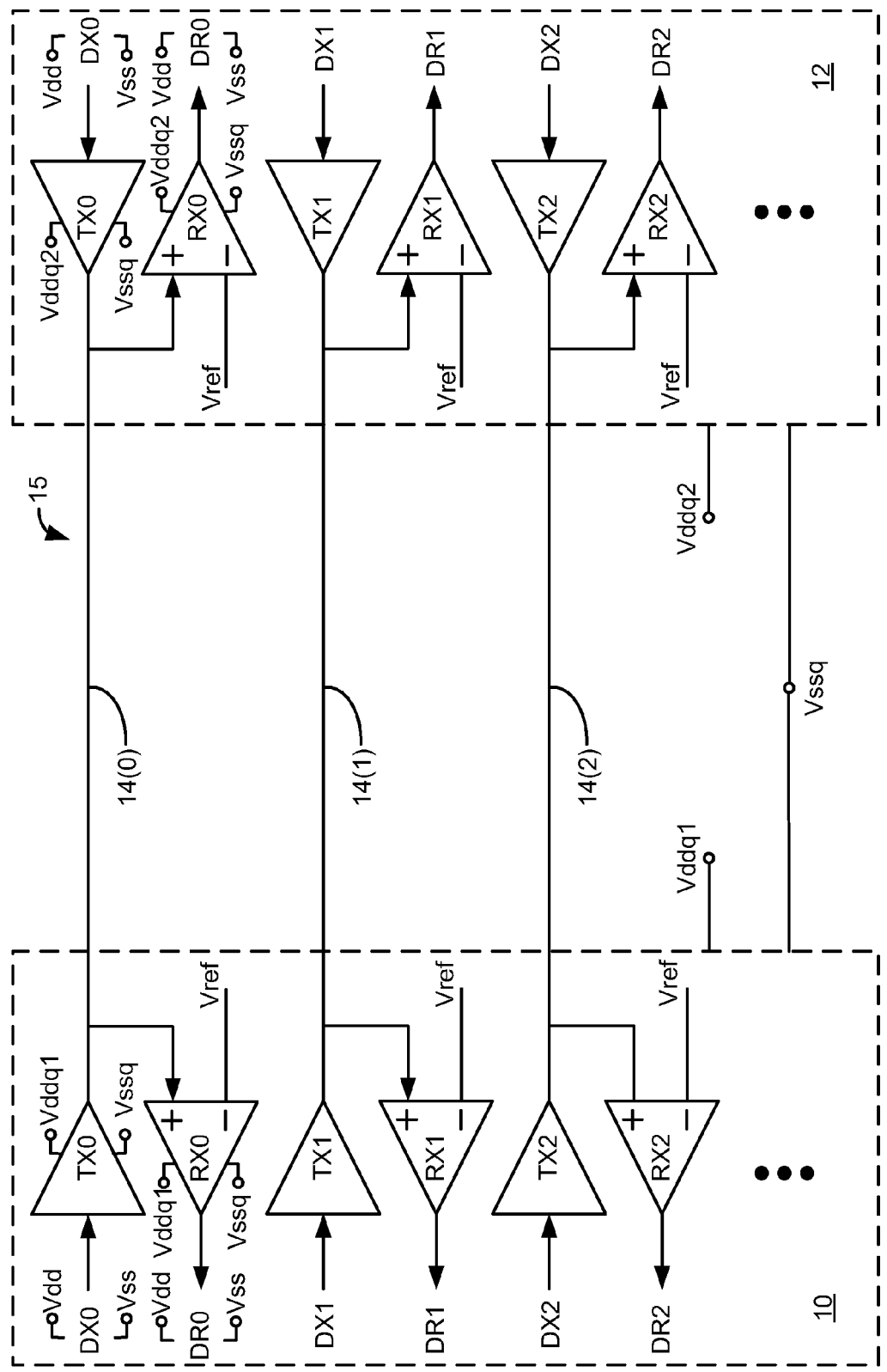
FIG. 4 illustrates a communication system employing Vssq-referenced signaling between two devices in which the system has a common Vssq supply, but in which each device has its own decoupled Vddq supply (Vddq1 and Vddq2).

Regardless, when Vddq is decoupled between the devices in the system of FIG. 4, it is sensible to employ Vssq-referenced signaling between the two devices 10 and 12 (FIG. 3, trace 26) because the two devices share the Vssq power supply in common. However, it can be problematic to use Vref voltage generators such as those already described in FIGS. 2A and 2B. The reason is such Vref generators produce a value for Vref that scales with perturbations in both of the power supplies Vddq and Vssq. As pointed out earlier, this can be useful when both power supplies are shared between the two devices 10 and 12, because such perturbations appearing in the transmitted data signal will be effectively canceled out by corresponding perturbations in Vref. But when one of the supplies (e.g., Vddq) is decoupled, this is not necessarily true.

The inventor has realized in a system such as that illustrated in FIG. 4 that it is useful to generate a value for Vref which tracks the power supply shared in common between the two devices 10 and 12 (Vssq), but which is otherwise independent of either of the values for the decoupled supplies (Vddq1 and Vddq2). FIG. 5A shows one such solution in the form of a new Vref generator 50. As will be explained shortly, Vref generator 50 produces a value for Vref that tracks the power supply shared between devices 10 and 12 (i.e., Vssq), but does not effectively track the other decoupled power supply voltages for the devices (i.e., Vddq1 or Vddq2) to any significant degree.

The Vref generator 50 illustrated in FIG. 5A comprises a cascoded current source comprising two transistors in series between the high supply and the Vref output: a current bias transistor 52 and a cascode transistor 54, both of which comprise P-channel transistors in this example. As one skilled in the art will appreciate, this cascode arrangement of transistors 52 and 54 effectively operates as an ideal current source 56, capable of producing a current, I, injectable into a resistor, Rb. The magnitude of current I is controllable by the gate voltage, Vadj, of current bias transistor 52. Assuming the P-channel transistors have a threshold voltage of approximately 0.5 Volts, Vadj in one application might be adjustable from a range of 0 Volts to Vddq −0.5 Volts, although of course this value will depend on other parameters such as Vcas and Rb. By contrast, the gate of cascode transistor 54, Vcas, is selected to ensure that both transistors 52 and 54 operate in the saturation or active region. To achieve this, the gate of transistor 54 (Vcas) will generally exceed the sum of the threshold voltage of the transistor 54 plus the effective gate-to-source voltage of the transistor 52 ($Vt_{Vcas}+Veff_{Vadj}$). The high output impedance of the cascode configuration is only partially dependent on the drain-to-source resistance of the transistor 54 ($Rds_{Vcas}$). Rather, the true approximate output impedance is actually the product of the transconductance of the top transistor with the drain-to-source resistances of both top and bottom transistors ($gm_{Vcas}Rds_{Vcas}Rds_{Vadj}$). Because Vcas is non-varying and because it is desirable that it be stable, Vcas may be derived from a band gap generator (not shown). Vcas in one application might be approximately Vddq −0.75 Volts. See also http://en.wikipedia.org/wiki/Cascode, which is submitted in the Information Disclosure Statement filed with this disclosure, and which is incorporated herein by reference.

Figure 5B:
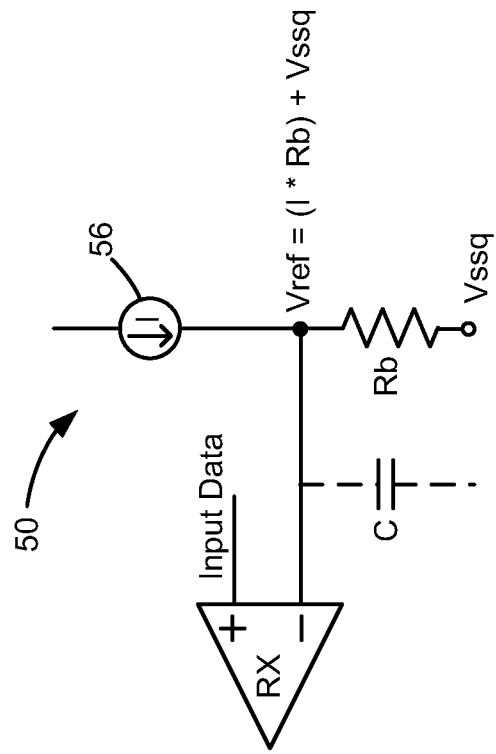
FIGS. 5A and 5B illustrate a Vref generator for use in the system of FIG. 4 in accordance with an embodiment of the invention, in which the Vref voltage generated tracks only the common Vssq supply, but not the decoupled high supplies.
Figure 5A:
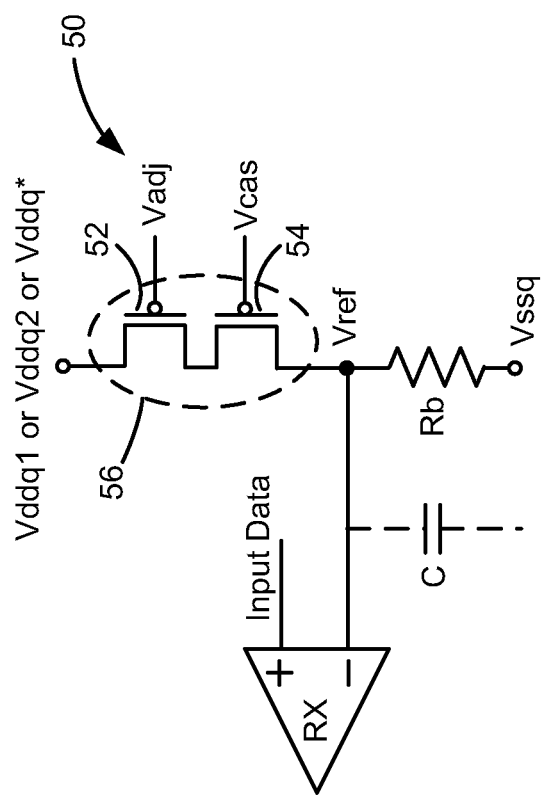

Because the cascoded arrangement of transistors 52 and 54 in the Vref generator 50 can be modeled as an ideal current source 56 with an infinite resistance, as shown in FIG. 5B, the magnitude of the high power supply becomes irrelevant, and thus is not shown in FIG. 5B. Expressed mathematically, Vref via this cascoded arrangement will equal (I*Rb)+Vssq, and so will track Vssq as desired without reliance on the high supply.

Because the generated value for Vref does not track the high power supply, it does not matter which voltage is used as the high power supply for Vref generator 50. Such high power supply voltage can comprise the I/O power supply for device 10 (Vddq1), the I/O power supply for device 12 (Vddq2), or some power supply voltage perhaps having no relation to either of the devices 10 or 12 (Vddq*). Recognizing this, FIG. 6A illustrates a Vref generator 50 located outside of the two devices 10 and 12 that provides Vref to the receivers RX in both of the devices. In another configuration not illustrated, the current source portion of the Vref circuitry (e.g., the cascode current source 56) is located external to the two devices 10 and 12, while resistance Rb is located on each of devices 10 and 12. Again, any of supplies Vddq1, Vddq2, or Vddq* can be used to power the Vref generator 50, as identified by the dotted lines in FIG. 6A.

FIG. 6B by contrast shows that each of devices 10 and 12 contains its own Vref generator 50 powered by its own high power supply—Vddq1 for device 10, and Vddq2 for device 12. This method for Vref generation is perhaps most logical and convenient. First, Vref can be generated for each of the devices' receivers internally, without the need to port Vref to the devices from the outside, which reduces device pin counts. Moreover, because each of the devices 10 and 12 has its own Vref generator 50, each of these generators can be independently tuned (e.g., by Vadj). Independent tuning can be important when it is realized that the transmitters TX in each of the devices 10 and 12 may differ: they may have different circuits, or different voltage values for their high power supplies Vddq1 or Vddq2, for example.

Figure 6C:
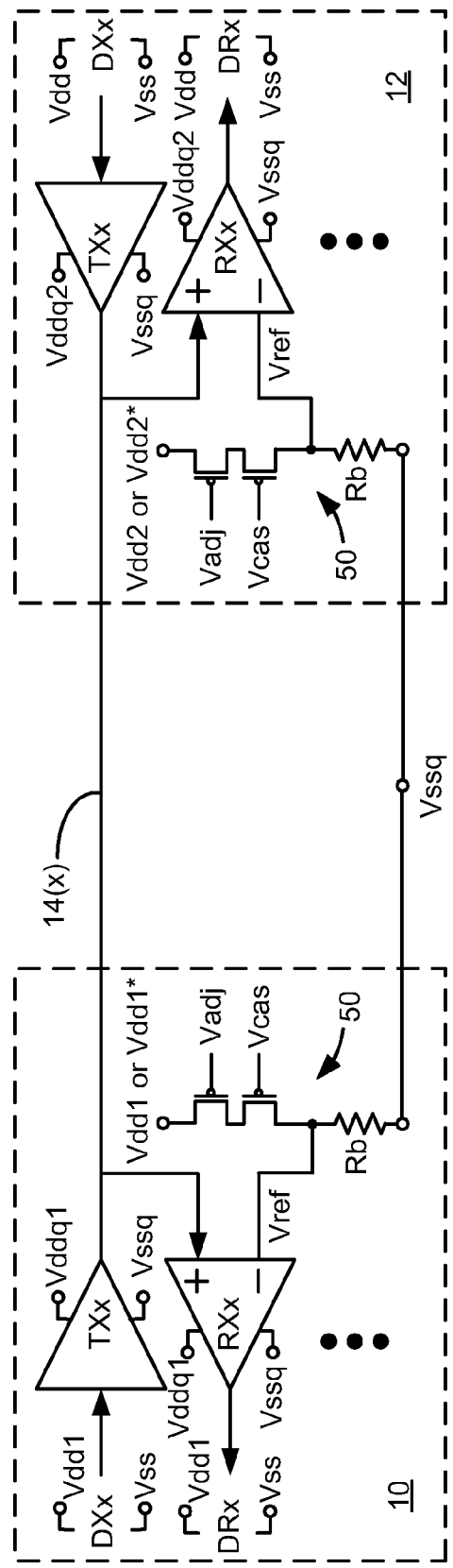

FIG. 6C shows yet another arrangement, and illustrates that the high power supply for Vref generator 50 need not necessarily comprise an I/O power supply (such as Vddq1, Vddq2, or Vddq*), but can instead comprise another external power supply voltage or even an internally-generated power supply voltage. For example, in device 10, the cascoded current source is coupled to Vdd1 (a power supply voltage generated internal to device 10 and derived from I/O power supply voltage Vddq1) or Vdd1* (an internal or external power supply voltage which is independent of Vddq1). The current source in device 12 is likewise coupled to either Vdd2 or Vdd2*. Because the current source 56 isolates Vref from the upper power supply voltage, any of such other power supplies can be used with the same beneficial effects noted earlier. It may be advantageous in a particular application to use such other power supplies. For example, the internally-generated supply (e.g., Vdd1) might be higher than other external supplies (Vddq1). This higher power supply voltage might be of benefit in the Vref generator 50, because it would provide additional headroom for the operation of the transistors 52 and 54 in the current source 56.

Determining an appropriate value for Rb in Vref generator 50 requires several considerations, and presents a trade-off between power and response time. The power drawn by Vref generator 50 is $I^2Rb$ or $Vref^2/Rb$, assuming Vssq is zero. The response time is proportional to Rb*C, where C equals any parasitic capacitance coupled to Vref (see FIGS. 5A and 5B), which will primarily comprise the input capacitance of the receiver(s) to which Vref is sent, the output capacitance of the Vref generator, and any capacitance inherent in any Vref routing. Having a small response time is beneficial to allow the Vref generator to produce a Vref value which can quickly track high-frequency Vssq-based perturbations in the input data to the receiver, RX. Larger values for Rb will cause Vref generator 50 to draw less power, but will cause longer response times. Conversely, smaller values for Rb will cause higher power draws, but faster response times. If the parasitic capacitance C is relatively high, Rb may need to be limited, despite the concomitant higher power draw.

Determination of an appropriate Rb also requires require consideration of the desired value for Vref. For example, if Vssq-referenced signaling is used, with data signals varying from approximately 0 V to 400 mV, then a midpoint value for Vref of 200 mV is generally reasonable. Because Vref generally equals I*Rb, then either of parameters Rb or I (via current source 56) can be altered to vary the magnitude of Vref, subject also to the considerations of power draw and responsiveness just discussed. According to one calculation, if Vref=200 mV, and assuming a power draw P=100 μW, a current I of 500 μA (where I=P/Vref), a frequency f=1 GHz, and a parasitic capacitance of C=50 fF, a value of Rb of approximately 400 kΩ was calculated as suitable. Of course, this value for Rb is merely one example, and as one skilled in the art will realize other values will also be possible taking into account the previously-noted considerations of power draw, responsiveness, and Vref magnitude.

Figure 7:
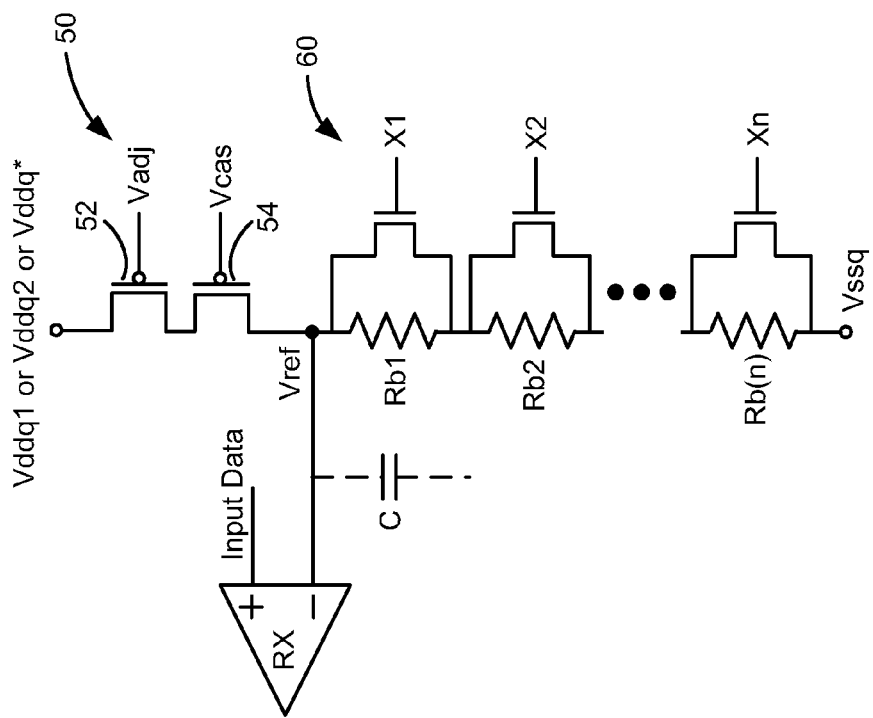

Rb may comprise a traditional passive resistor, such as a polysilicon resistor, or may be comprised of one or more active elements, such as transistors. Rb can also be adjustable allowing Vref to be tuned, and can be made adjustable in any manner known in the art. For example, and a shown in FIG. 7, a resistor network 60 can be used, with various of n resistances Rb(x) included in or disclused from Rb in accordance with their digital control signals, X1-Xn.

Figure 8:
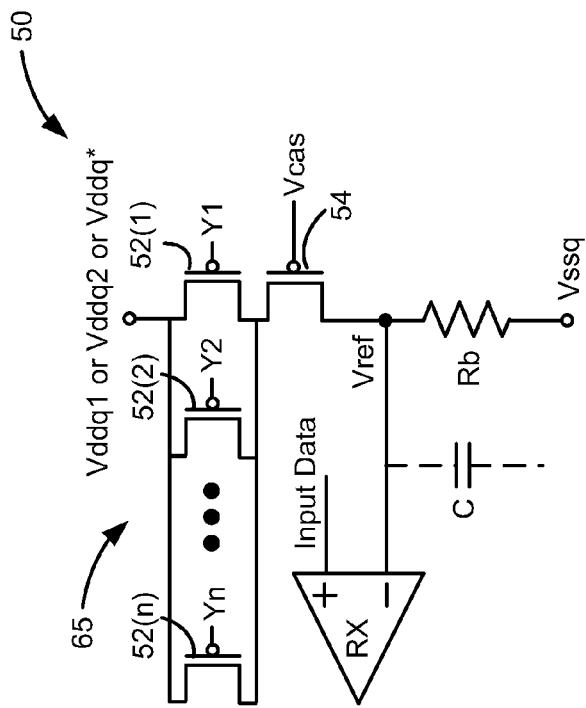
FIGS. 7 and 8 illustrate different manners for tuning the disclosed Vref generator.

Vref can also be adjusted in Vref generator 50 by adjusting the current, I, that the cascoded current source 56 provides. As already noted, adjustment can come from adjusting the voltage, Vadj, at the gate of the current bias transistor 52. Because current bias transistor 52 comprises a P-channel transistor, one skilled in the art will recognize that increasing I will require decreasing Vadj. Such analog control of Vadj can occur in any well-known manner, and no particular manner is important. Alternatively, and as shown in FIG. 8, the current I can be adjusted by replacing the current bias transistor 52 with a network 65 of current bias transistors 52(1)-52(n), each selectable via digital control signals Y1-Yn. In this example, each of the transistors 52 can have different width-to-length (W/L) ratios, and therefore provide differing contributions to the overall current, I. For example, each transistor 52 can be made exponentially bigger (W/L=1, 2, 4, 8, etc.), which would allow for precise control of current I via the control signals Y1-Yn.

FIGS. 9A-9C shows an alternative communication system and design for the Vref generator 50'. In this system, and as shown in FIG. 9A, the high supply (Vddq) is shared between the two devices, but the low supplies (Vssq1 and Vssq2) are decoupled from each other. Such a system would logically employ Vddq-referenced (high common mode) signaling as discussed earlier. In this system, it is desirable for the Vref generator to produce a value for Vref that tracks the common supply (Vddq), but that does not track either of the decoupled low supplies (Vssq1 or Vssq2). This requires modification to the Vref generator 50' as shown in FIGS. 9B and 9C. The design and operation of Vref generator 50' is essentially the same as the Vref generator 50 discussed earlier, except that the polarity of the circuit has been changed accordingly: N-channel transistors 52 and 54 are used, and these now appear adjacent to the uncommon low supply. One skilled in the art will understand the polarity difference between Vref generators 50 and 50' and so such differences will not be belabored. The value for Vref produced by Vref generator 50' is Vref=Vddq−(I*Rb), which tracks Vddq as desired in the Vddq-referenced system of FIG. 9A.

Although a cascoded arrangement of transistors 52 and 54 is a preferred current source 56 to supply the current I and to isolate the generated Vref voltage from the upper supply due to the inherently high output impedance, it should be understood that other current sources could be used as well. For example, a single transistor could be used to supply the current I, but in this case, the output impedance of the transistor would need to be accounted for when setting the Vref voltage level (e.g., Vref=I*(Rb∥Rout)). The use of cascoded transistors should therefore not be understood as the exclusive means for constructing current source 56, and different types of current sources might be more logical in differing applications, perhaps dependent on the operating voltage, power draw, responsiveness, and/or Vref level considerations previously discussed.

While the Vref generators disclosed herein comprised metal oxide semiconductor field effect transistors (MOSFETs), the Vref generator is not so limited. The same functionality, including the cascoded current source, is achievable using bipolar junction transistors (BJTs) as well. Still other embodiments of the Vref generator can be implemented in a BiCMOS process, with one of the two transistors in the cascoded current source comprising a MOSFET and the other a BJT.

Other modifications to the disclosed technique and circuitry comprise generating more than one reference voltage. For example, for data having three logic states for example, two Vref voltages (Vref1 and Vref 2) could be generated to allow each of the three logic states to be sensed. By using two different Vref generators, or by dividing the resistor Rb into two resistors, the two Vref values can be generated, both of which will vary with Vssq, but which will remain independent of Vddq as desired.

While some implementations have been disclosed, it should be understood that the disclosed circuitry can be achieved in many different ways to the same useful ends as described herein. In short, it should be understood that the inventive concepts disclosed herein are capable of many modifications. To the extent such modifications fall within the scope of the appended claims and their equivalents, they are intended to be covered by this patent.

What is claimed is:

1. A communication system, comprising:
a receiver powered by a first power supply voltage and a second power supply voltage, the receiver to receive input data from a communication channel and to receive a reference voltage, the input data is to be referenced to the first power supply voltage, the input data having a reduced swing signal in which one logic state comprises the first power supply voltage and another logic state comprises a voltage between the first power supply voltage and the second power supply voltage, the receiver is to compare the input data to the reference voltage; and
a generator to produce the reference voltage, the reference voltage being independent of the second power supply.

2. The system of claim 1, wherein the generator comprises a series connection of a current source to produce a current I and a resistance R, wherein the reference voltage comprises I*R.

3. The system of claim 2, wherein the current source is adjustable to adjust the current I.

4. The system of claim 2, wherein the resistance R is adjustable.

5. The system of claim 2, wherein the second power supply voltage is coupled to the current source, and wherein the resistance is coupled to the first power supply voltage.

6. The system of claim 2, wherein a third power supply voltage is coupled to the current source, and wherein the resistance is coupled to the first power supply voltage.

7. A communication system, comprising:
a first device comprising a transmitter coupled to a communication channel, the transmitter to transmit data on the communication channel that is referenced to a first power supply voltage, the transmitter being powered by a second power supply voltage and the first power supply voltage, the data having a reduced swing signal in which one logic state comprises the first power supply voltage and another logic state comprises a voltage between the first power supply voltage and the second power supply voltage; and
a second device comprising a receiver coupled to the communication channel, and a generator to produce a reference voltage for the receiver, the reference voltage is to depend on the first power supply voltage but does not depend on any other power supply voltage associated with the first device and the second device.

8. The system of claim 7, wherein the first power supply voltage comprises a system ground for the first and second devices.

9. The system of claim 7, wherein the reference voltage is approximately at a midpoint between voltages for each of a plurality of logic states in the data.

10. The system of claim 7, wherein the generator comprises a current source for isolating the reference voltage from the second power supply voltage.

11. The system of claim 7, wherein the current source comprises a cascoded current source.

12. A communication system, comprising:
a first device powered by a first power supply voltage and a second power supply voltage;
a second device powered by the first power supply voltage and a third power supply voltage;
at least one communication channel between the first device and the second device to communicate data; and
at least one generator to produce a reference voltage to receive the communicated data at either or both of the first device and the second device, the reference voltage to depend on the first power supply voltage but to be independent of the second power supple voltage and the third power supply voltage.

13. The system of claim 12, wherein the communicated data is referenced to the first power supply voltage.

14. The system of claim 12, wherein there is only one generator to produce the reference voltage, and wherein the reference voltage is input to both of the first device and the second device.

15. The system of claim 12, further comprising a first generator in the first device to produce a first reference voltage to receive the communicated data at the first device, and a second generator in the second device to produce a second reference voltage to receive the communicated data at the second device.

16. The system of claim 12, wherein a value of the second power supply voltage and the third power supply voltage are the same.

17. The system of claim 12, wherein the at least one generator comprises a serial connection between a current source and a resistor.

18. The system of claim 17, wherein either of the second power supply voltage or the third power supply voltage is coupled to the serial connection at the current source, and wherein the first power supply voltage is coupled to the serial connection at the resistor.

19. The system of claim 12, wherein the current source comprises a serial connection of two transistors.

20. The system of claim 12, wherein the at least one generator is powered by the first power supply voltage and a fourth power supply voltage.

21. The system of claim 20, wherein the fourth power supply is generated internally to either or both of the first device and the second device.

* * * * *